United States Patent
White et al.

(10) Patent No.: US 7,375,946 B2
(45) Date of Patent: May 20, 2008

(54) METHOD AND APPARATUS FOR DECHUCKING A SUBSTRATE

(75) Inventors: John M. White, Hayward, CA (US); Wendell T. Blonigan, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 226 days.

(21) Appl. No.: 10/919,457

(22) Filed: Aug. 16, 2004

(65) Prior Publication Data

US 2006/0034032 A1 Feb. 16, 2006

(51) Int. Cl.
*H01T 23/00* (2006.01)
(52) U.S. Cl. ...................................... 361/234
(58) Field of Classification Search ............... 361/234
See application file for complete search history.

(56) References Cited

U.S. PATENT DOCUMENTS

| | | | |
|---|---|---|---|
| 5,221,450 A * | 6/1993 | Hattori et al. | 204/192.32 |
| 5,380,566 A | 1/1995 | Robertson et al. | |
| 5,459,632 A | 10/1995 | Birang et al. | |
| 5,612,850 A * | 3/1997 | Birang et al. | 361/234 |
| 5,764,471 A | 6/1998 | Burkhart | |
| 5,849,628 A * | 12/1998 | Sandhu et al. | 438/488 |
| 5,880,924 A * | 3/1999 | Kumar et al. | 361/234 |
| 5,894,400 A | 4/1999 | Graven et al. | |
| 5,946,184 A * | 8/1999 | Kanno et al. | 361/234 |
| 6,099,697 A * | 8/2000 | Hausmann | 204/192.12 |
| 6,221,221 B1 * | 4/2001 | Al-Shaikh et al. | 204/298.02 |
| 2003/0236004 A1 | 12/2003 | Sung et al. | |
| 2004/0178788 A1 * | 9/2004 | Suehira et al. | 324/158.1 |
| 2006/0005771 A1 * | 1/2006 | White et al. | 118/728 |

OTHER PUBLICATIONS

U.S. Appl. No. 09/593,848, filed Jun. 14, 2000 entitled: Method and Apparatus for Balancing an Electrostatic Force Produced by An Electrostastic Chuck, by Loo, et al.

* cited by examiner

*Primary Examiner*—Michael Sherry
*Assistant Examiner*—Lucy Thomas
(74) *Attorney, Agent, or Firm*—Patterson & Sheridan LLP

(57) ABSTRACT

A method and apparatus for dechucking a substrate is provided. In one embodiment, a processing chamber is provided that includes a grounded chamber body having a substrate support assembly disposed in an interior volume. A dechucking circuit selectively couples the substrate support assembly to ground or to a power source. In another embodiment of the invention, a method for dechucking a substrate includes the steps of completing a plasma process on a substrate disposed on a grounded substrate support assembly, disconnecting the substrate support assembly from ground, and applying a dechucking voltage to the substrate support assembly.

25 Claims, 5 Drawing Sheets

METHOD AND APPARATUS FOR DECHUCKING A SUBSTRATE

BACKGROUND OF THE INVENTION

1. Field of the Invention

The embodiments of the invention generally relate to a method and apparatus for dechucking a substrate.

2. Description of the Related Art

Liquid crystal displays or flat panels are commonly used for active matrix displays such as computer and television monitors. Generally, flat panels comprise two plates having a layer of liquid crystal material sandwiched therebetween. At least one of the plates includes at least one conductive film disposed thereon that is coupled to a power source. Power, supplied to the conductive film from the power supply, changes the orientation of the crystal material, creating a patterned display.

In order to manufacture these displays, a substrate, such as a glass or polymer workpiece, is typically subjected to a plurality of sequential processes to create devices, conductors and insulators on the substrate. Each of these processes is generally performed in a process chamber configured to perform a single step of the production process. In order to efficiently complete the entire sequence of processing steps, a number of process chambers are typically coupled to a central transfer chamber that houses a robot to facilitate transfer of the substrate between the process chambers. A processing platform having this configuration is generally known as a cluster tool, examples of which are the families of AKT plasma enhanced chemical vapor deposing (PECVD) processing platforms available from AKT America, Inc., of Santa Clara, Calif.

During operation, the robot disposed in the transfer chamber moves substrates between the chambers on an end effector. The robot positions the substrate over a substrate support disposed in the process chamber. The substrate support includes a transfer mechanism, such as a plurality of lift pins, that facilitates exchange of the substrate between the end effector and the substrate support.

As demand for flat panels has increased, so has the demand for larger sized substrates. For example, large area substrates utilized for flat panel fabrication have increased in area from 550 mm by 650 mm to over 1,500 mm by 1,800 mm in just a few years and are envisioned to exceed four square meters in the near future. This growth in the size of the large area substrates has presented new challenges in handling and production. For example, the larger contact surfaces between the substrate support and the substrate has increased the amount of static attraction of the substrate to substrate support after processing. This increased attraction between the substrate and substrate support requires more force to separate the substrate from the substrate support. The increased force exerted by the lift pins on the substrate, counteracted by the high attraction between the substrate and substrate support, results in an increased potential for substrate damage while being lifted (e.g., separated) from the substrate support. Moreover, in instances where the attraction between the substrate support and substrate is high, the center of the substrate may remain in contact with the substrate support as the lift pins begin to separate the substrate from the substrate support, thereby excessively deflecting the substrate. As the substrate deflects, the lift pins may slide along the bottom surface of the substrate, creating a scratch which may cause substrate breakage. Additionally, if the substrate "springs" back to its natural shape as the center of the substrate comes free of the substrate support, the substrate may jump and/or walk on the lift pins, potentially creating particles or substrate damage. Furthermore, if the substrate moves laterally relative to the lift pins, the substrate may become misaligned on the robot's end effector, thereby increasing the probability of substrate damage or poor processing results in subsequent processes due to substrate misalignment.

Therefore, there is a need for an improved method and apparatus for dechucking a substrate.

SUMMARY OF THE INVENTION

A method and apparatus for dechucking a substrate is provided. In one embodiment, a processing chamber is provided that includes a grounded chamber body having a substrate support assembly disposed in an interior volume. A dechucking circuit selectively couples the substrate support assembly to ground or to a power source.

In another embodiment of the invention, a method for dechucking a substrate includes the steps of completing a plasma process on a substrate disposed on a grounded substrate support assembly, disconnecting the substrate support assembly from ground, and applying a dechucking voltage to the substrate support assembly.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

Figure 1:
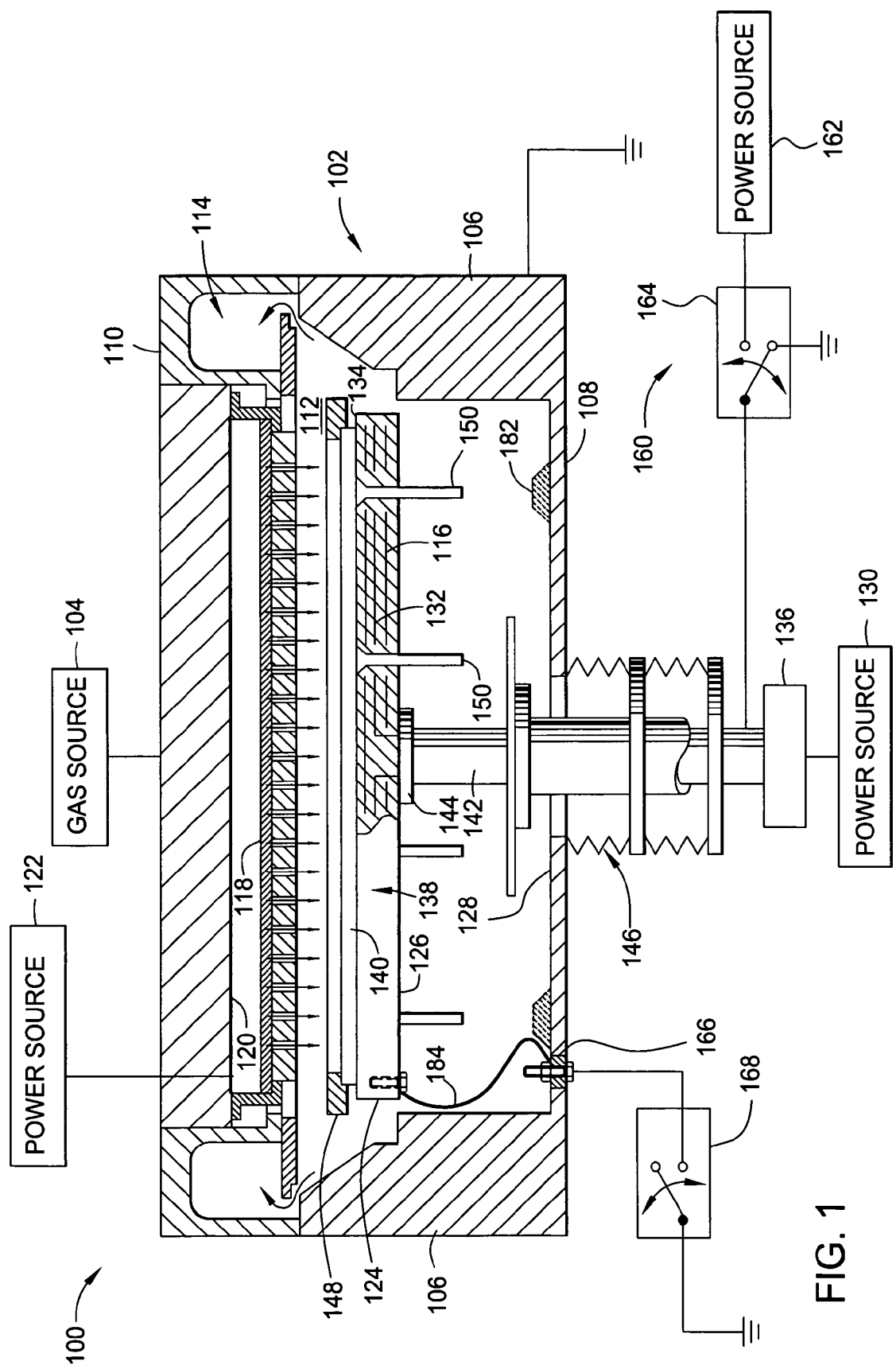
FIG. 1 is a cross sectional view of one embodiment of a plasma enhanced chemical vapor deposition system having a dechucking circuit.

To facilitate understanding, identical reference numerals have been used, where possible, to designate identical elements that are common to the figures. It is to be noted, however, that the appended drawings illustrate only typical embodiments of this invention and are therefore not to be considered limiting of its scope, for the invention may admit to other equally effective embodiments.

DETAILED DESCRIPTION

The invention generally relates to a large area substrate processing chamber and a method for dechucking substrates from a substrate support positioned therein. Although the invention is illustratively described, shown and practiced within a large area substrate processing system, the invention finds utility in other processing chambers where it is desirable to reduce and/or eliminate the electrostatic attraction between a workpiece, such as a substrate, semiconductor wafer or other workpiece, and the surface of the workpiece is supported thereon.

FIG. 1 is a cross sectional view of one embodiment of a plasma enhanced chemical vapor deposition system 100 having one embodiment of a dechucking circuit 160. The dechucking circuit 160 facilitates removal of a substrate 140 from a substrate support assembly 138 after processing by reducing and/or eliminating the electrostatic attraction between the substrate and substrate support assembly. It is contemplated that embodiments of the dechucking circuit described herein, along with derivations thereof, may be utilized in other processing systems and with other workpiece supports.

In the embodiment depicted in FIG. 1, the system 100 includes a grounded chamber body 102 coupled to a gas source 104 and a power source 122. The chamber body 102 has sidewalls 106, a bottom 108, and a lid assembly 110 that define a process volume 112. The process volume 112 is typically accessed through a port (not shown) in the sidewall 106 that facilitates movement of a large area substrate 140 (hereinafter referred to as "substrate 140") into and out of the chamber body 102. The large area substrate 140 may be a glass or polymer workpiece, and in one embodiment has a plan surface area greater than about 0.25 meters. The sidewalls 106 and bottom 108 of the chamber body 102 are typically fabricated from a unitary block of aluminum or other material compatible with process chemistries. The lid assembly 110 contains a pumping plenum 114 that couples the process volume 112 to an exhaust port that is coupled to various pumping component (not shown).

The lid assembly 110 is supported by the sidewalls 106 and can be removed to service the chamber body 102. The lid assembly 110 is generally comprised of aluminum. A distribution plate 118 is coupled to an interior side 120 of the lid assembly 110. The distribution plate 118 is typically fabricated from aluminum. The center section of the distribution plate 118 includes a perforated area through which process and other gases supplied from the gas source 104 are delivered to the process volume 112. The perforated area of the distribution plate 118 is configured to provide a uniform distribution of gases passing through the distribution plate 118 into the chamber body 102. The power source 122 is coupled to the distribution plate 118 to provide an electrical bias that energizes the process gas and sustains a plasma formed from process gas in the interior volume 112 below the gas distribution plate 118 during processing.

The heated substrate support assembly 138 is centrally disposed within the chamber body 102. The support assembly 138 supports the substrate 140 during processing. The substrate support assembly 138 generally includes an electrically conductive body 124 supported by a shaft 142 that extends through the chamber bottom 108. The support body 124 is generally polygonal in shape and covered with an electrically insulative coating (not shown) over at least the portion of the body 124 that supports the substrate 140. The coating may also cover other portions of the body 124. The substrate support assembly 138 is normally coupled to ground at least during processing.

The support body 124 may be fabricated from metals or other comparably electrically conductive materials. The insulative coating may be a dielectric material such as an oxide, silicon nitride, silicon dioxide, aluminum dioxide, tantalum pentoxide, silicon carbide or polyimide, among others, which may be applied by various deposition or coating processes, including, but not limited to, flame spraying, plasma spraying, high energy coating, chemical vapor deposition, spraying, adhesive film, sputtering and encapsulating.

In one embodiment, the substrate support assembly 138 includes an aluminum body 124 that encapsulates at least one embedded heating element 132 and a thermocouple (not shown). The body 124 may include one or more stiffening members (not shown) comprised of metal, ceramic or other stiffening materials embedded therein.

The heating element 132, such as an electrode or resistive element, is coupled to a power source 130 and controllably heats the support assembly 138 and substrate 140 positioned thereon to a predetermined temperature. Typically, the heating element 132 maintains the substrate 140 at a uniform temperature of about 150 to at least about 460 degrees Celsius during processing. The heating element 132 is electrically floating relative to the body 124.

Generally, the support assembly 138 has a lower side 126 and an upper side 134 that supports the substrate 140 thereon. The lower side 126 has a stem cover 144 coupled thereto. The stem cover 144 generally is an aluminum ring coupled to the support assembly 138 that provides a mounting surface for the attachment of the shaft 142 thereto.

Generally, the shaft 142 extends from the stem cover 144 through the chamber bottom 108 and couples the support assembly 138 to a lift system 136 that moves the support assembly 138 between an elevated process position (as shown) and a lowered position that facilitates substrate transfer. A bellows 146 provides a vacuum seal between the chamber volume 112 and the atmosphere outside the chamber body 102 while facilitating the vertical movement of the support assembly 138. The shaft 142 additionally provides a conduit for electrical and thermocouple leads between the support assembly 138 and other components of the system 100.

The shaft 142 may be electrically isolated from the chamber body 102. In the embodiment depicted in FIG. 1, a dielectric isolator 128 is disposed between the shaft 142 and chamber body 102. The isolator 128 may additionally support or be configured to function as a bearing for the shaft 142.

The support assembly 138 additionally supports a circumscribing shadow frame 148. Generally, the shadow frame 148 prevents deposition at the edge of the substrate 140 and support assembly 138 so that the substrate 140 does not stick to the support assembly 138.

The support assembly 138 has a plurality of holes disposed therethrough that accept a plurality of lift pins 150. The lift pins 150 are typically comprised of ceramic or anodized aluminum and have first ends that are substantially flush with or slightly recessed from the upper side 134 of the support assembly 138 when the lift pins 150 are in a normal position (i.e., retracted relative to the support assembly 138). As the support assembly 138 is lowered to a transfer position, the lift pins 150 come in contact with the bottom 108 of the chamber body 102 and are displaced through the support assembly 138 to project from the upper side 134 of the support assembly 138, thereby placing the substrate 140 in a spaced-apart relation to the support assembly 138.

In one embodiment, lift pins 150 of varying lengths (as shown in FIG. 1) are utilized so that they come into contact with the bottom 108 and are actuated at different times. For example, the lift pins 150 that are spaced around the outer edges of the substrate 140, combined with relatively shorter lift pins 150 spaced inwardly from the outer edges toward the center of the substrate 140, allow the substrate 140 to be first lifted from its outer edges relative to its center. In another embodiment, lift pins 150 of a uniform length may be utilized in cooperation with bumps or plateaus 182 (shown in phantom) positioned beneath the outer lift pins 150, so that the outer lift pins 150 are actuated before and displace the substrate 140 a greater distance from the upper surface 134 than the inner lift pins 150. Alternatively, the chamber bottom 108 may comprise grooves or trenches positioned beneath the inner lift pins 150, so that the inner lift pins 150 are actuated after and displaced a shorter distance than the outer lift pins 150. Embodiments of a system having lift pins configured to lift a substrate in an edge to center manner from a substrate support that may be adapted to benefit from the invention are described in U.S. patent application Ser. No. 10/308,385 filed Dec. 2, 2002 by Shang, et al., and described in U.S. patent application Ser. No. 10/460,196 filed Jun. 12, 2003 by Blonigan, et al., both of which are hereby incorporated by reference in there entireties.

The support assembly 138 is generally grounded during processing such that an RF power supplied by the power source 122 to the distribution plate 118 (or other electrode positioned within or near the lid assembly 110 of the chamber body 102) may excite the gases disposed within the process volume 112 between the support assembly 138 and the distribution plate 118. The RF power from the power source 122 is generally selected commensurate with the size of the substrate 140 to drive the chemical vapor deposition process.

Optionally, the substrate support assembly may be grounded by one or more RF ground return paths 184 that provide a low-impedance RF return path between the support body 124 and ground. The RF ground return path 184 may be coupled directly or indirectly to ground, for example, through the chamber body 102.

In one embodiment, the RF ground return path 184 is a plurality of flexible straps (one of which is shown in FIG. 1) coupled between a perimeter of the body 124 and the chamber bottom 108. The RF ground return paths 184 may be fabricated from aluminum, beryllium copper or other suitable RF conducting material.

To facilitate dechucking of the substrate from the substrate support assembly (i.e., to overcome the static attraction between the substrate and substrate support assembly that may be generated during substrate processing, for example, during plasma processing of the substrate), the dechucking circuit 160 is coupled to the substrate support assembly 138. The dechucking circuit 160 includes a power source 162 and switch 164 configured to provide a signal to the substrate support assembly 132 to remove or reduce the static attraction between the substrate 140 and substrate support assembly 138. The switch 164 selectively connects the substrate support assembly 138 to ground during processing, and to the power source 164 when dechucking of the substrate 140 is desired.

The signal provided by the power source 162 may be RF or DC, and may be a steady state or pulsed signal. The magnitude, duration and/or number of pulses of the signal produced by the dechucking circuit 160 are generally commensurate with the amount of static attraction between the substrate support assembly 138 and substrate 140 which must be overcome. The static force is typically dependent on the size of the substrate, the materials deposited on the substrate, and processing parameters, such as plasma power during processing and materials comprising the substrate support, among others.

In embodiments where the substrate support assembly 138 is grounded by one or more RF ground return paths 184, the electrical signal provided by the power source 162 may be configured to cause to RF ground return path 184 (selected with a sufficiently high impedance) to become inductively open, thereby isolating the support assembly 138 from ground. For example, a pulsed DC or RF signal may be selected so that substantially no current flows through the RF ground return path 184 during application of the dechucking signal to the substrate support assembly 138. Alternatively, the RF ground return path 184 may be isolated from the chamber body 102 by an insulator 166 (shown in phantom) and coupled to ground through a switch 168. The switch 168 may be operated to selectively couple the substrate support assembly 138 to ground during processing, and to open the circuit between the substrate support assembly 138 and ground during dechucking (i.e., when power is applied by the power source 162 to the support assembly 138).

Figure 2:
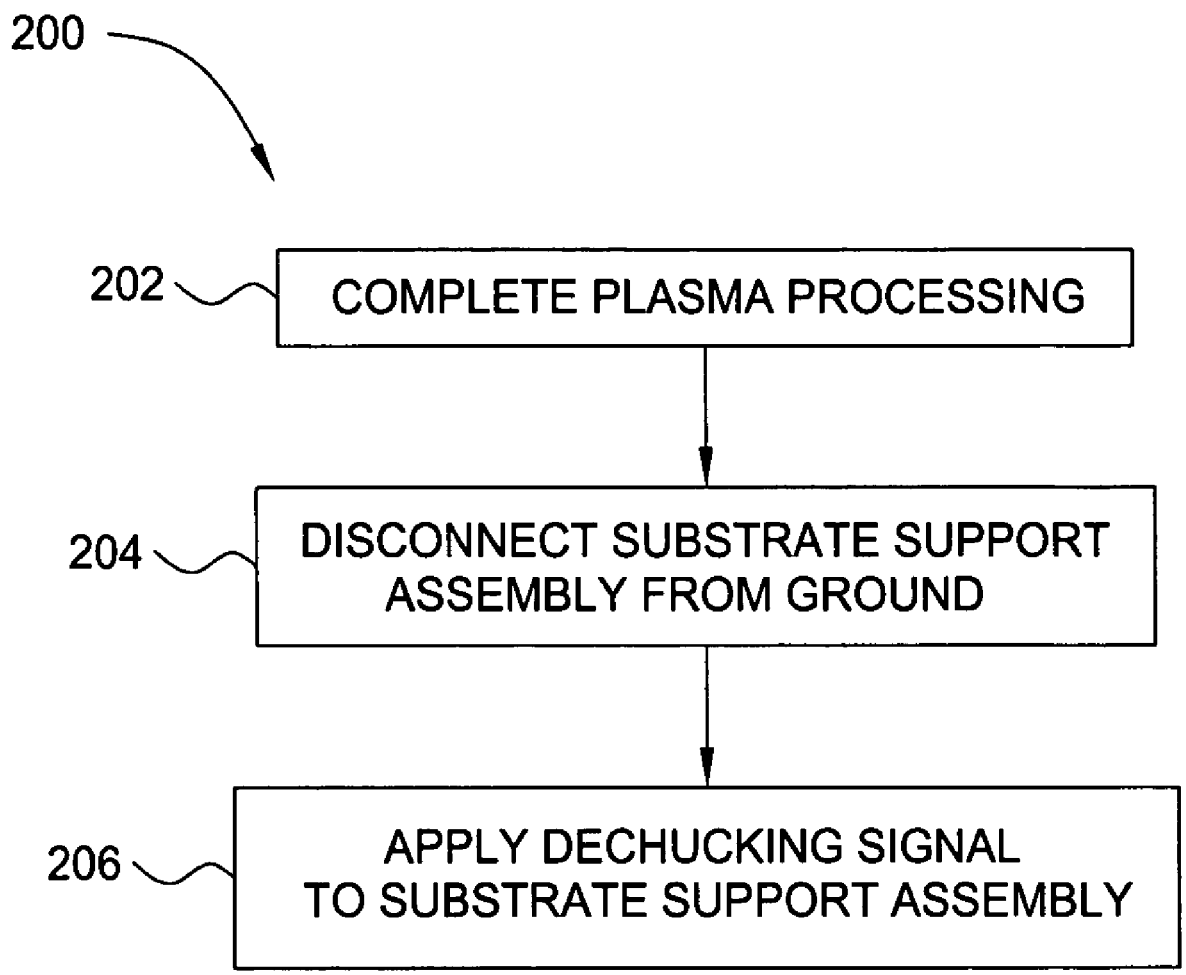
FIG. 2 is a flow diagram of one embodiment of a method for dechucking a substrate.

FIG. 2 is a flow diagram of one embodiment of a method 200 for dechucking a substrate which may be practiced with the processing system 100 of FIG. 1. It is contemplated that the method 200 may be practiced on processing systems having different configurations and for other types of dechucking applications as mentioned above. The method 200 begins at step 202 with the completion of a plasma processing step performed within the chamber body 102. In one embodiment, a plasma enhanced chemical vapor deposition step performed may deposit a layer of low temperature silicon oxynitrid passivation, silicon nitride (SiN) or silicon oxynitride (SiON), among other PECVD films.

At step 204, the substrate support assembly 138 is disconnected from ground. The embodiment depicted in FIG. 1, the substrate support assembly 138 is disconnected from ground by actuating the switch 160 to couple the power source 162 to the support assembly 138. In embodiments having one or more RF ground return paths 184, the switch 168 is opened if the signal provided during dechucking at step 206 does not inductively open the ground circuit through the RF ground return paths 184.

At step 206, a dechucking signal is applied from the power source 160 to the substrate support assembly 138. The dechucking signal, as described above, provides a voltage to the substrate support 138 that is sufficient to eliminate, or sufficiently reduce the static attraction between the substrate support 138 and substrate 140 so that the substrate 140 may be easily separated from the substrate support 138 by the lift pins 150.

The method 200 may be applied sequentially or simultaneously with other methods which assist in dechucking a substrate. For example, the lift pins 150 supporting the outer regions of the substrate 140 may be actuated to lift the substrate 140 at the outer regions of the substrate prior to, and/or during the application of the dechucking signal.

Another method which may be incorporated into the dechucking method 200 includes subjecting the substrate to a plasma of an inactive gas or other ionized gas which does not adversely affect the material deposited on the substrate and which also does not cause additional material to be deposited on the substrate before and/or during the application of the dechucking signal at step 206. The plasma of inactive gas may applied in addition to lift the substrate at its perimeter, thereby exposing the underside of the substrate to the plasma, thereby dissipating the static attraction. A method which may be adapted to benefit from the invention in such a manner is described in U.S. Pat. No. 5,380,566 filed Jan. 10, 1995 to Robertson et al., which is incorporated by reference in its entirety. As the method 200 reduces and/or eliminates the static attraction between the substrate 140 and substrate support assembly 138, the substrate 140 may be separated from the support assembly 138 more efficiently. Thus, the force applied other substrate 140 by the lift pins 150 may be reduced, thereby reducing potential damage to the substrate.

Figure 3:
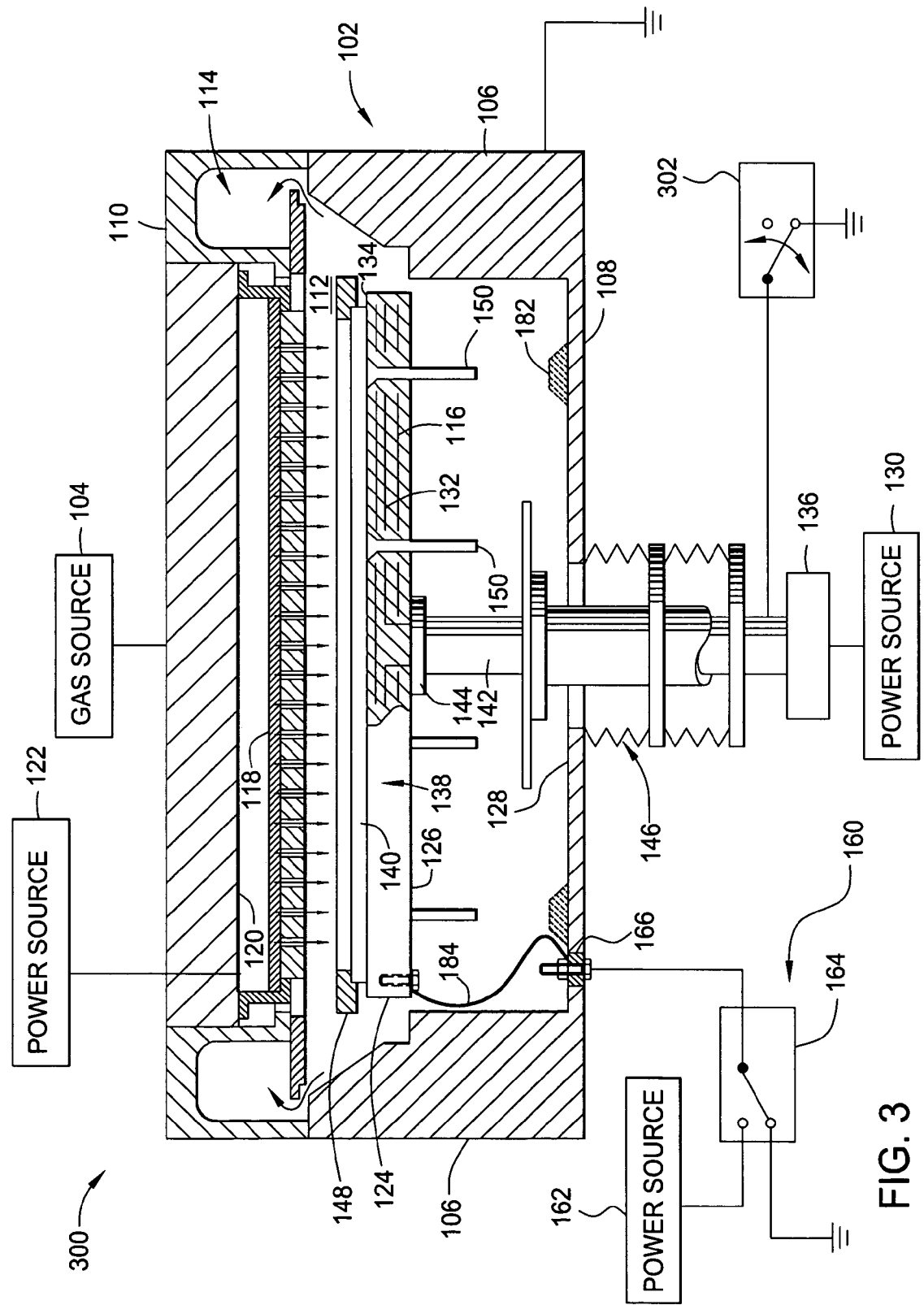
FIG. 3 is a cross sectional view of another embodiment of a plasma enhanced chemical vapor deposition system having a dechucking circuit.

FIG. 3 is a cross sectional view of another embodiment of a plasma enhanced chemical vapor deposition system 300. The system 300 generally includes a process chamber body 102 coupled to a power source 122 and a gas source 104, as described above. A dechucking circuit 160 is coupled to a substrate support 138 disposed in the process volume 112 of the chamber body 102 by one or more RF ground paths 184. A switch 164 is provided in the dechucking circuit 160 to selectively couple the substrate support 138 to ground during processing, and to a power source 162 to facilitate dechucking of the substrate 140. An insulator 166 is provided to isolate the conductive feed-through 304, coupling the RF ground return path 184 and the dechucking circuit 160, from the grounded chamber body 102.

The shaft 142 coupling the substrate support assembly 138 to the lift mechanism 136 through the chamber bottom 108 may be selectively coupled to ground through a switch 302 during processing. The switch 302 is open during application of the dechucking signal from the power source 162. The shaft 142 is electrically isolated from the chamber bottom 108 by an isolator 128.

Figure 4:
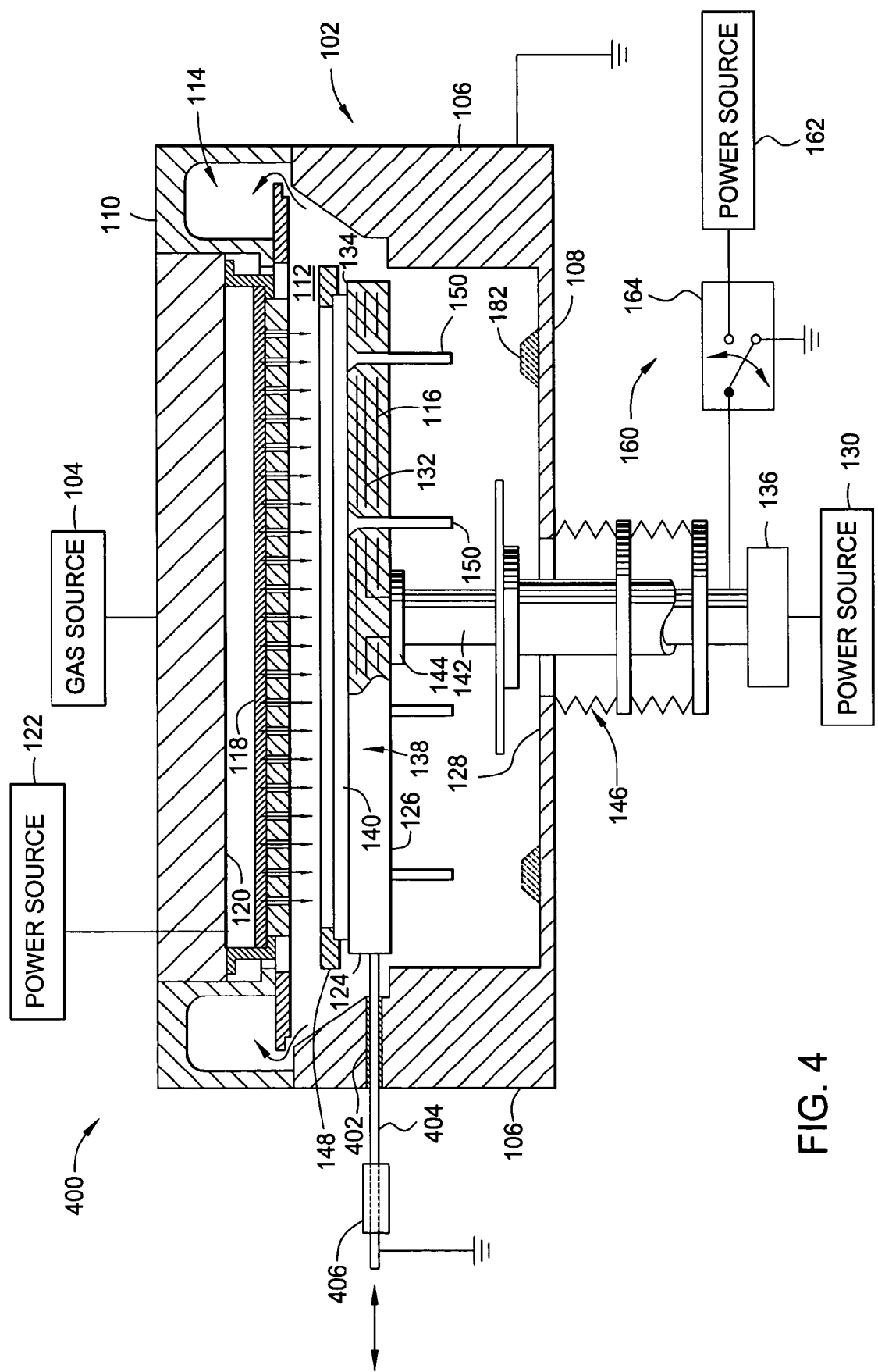
FIG. 4 is a cross sectional view of another embodiment of a plasma enhanced chemical vapor deposition system having a dechucking circuit.

FIG. 4 depicts is a cross sectional view of another embodiment of a plasma enhanced chemical vapor deposition system 400. The system 400 is configured similar to the system 100 described above, except wherein the substrate support assembly 138 is grounded by one or more ground members 404. The dechucking circuit 160 selectively couples a power source 162 to the substrate support assembly 138 through a switch 162, as described above.

The ground member 404 is moveable between a position contacting the substrate support assembly 138 during processing, as shown in FIG. 4, and a position clear of the substrate support assembly 138 during dechucking of the substrate 140. The ground member 404 is isolated from the side walls 106 of the chamber body 102 by an isolator 402. An actuator 406 interacts with the ground member 404 to control the displacement of the ground member 404. The actuator 406 may be a solenoid linear actuator, pneumatic or hydraulic cylinder or other device suitable to move the ground member 404 into and out of contact with the substrate support assembly 138.

Figure 5:
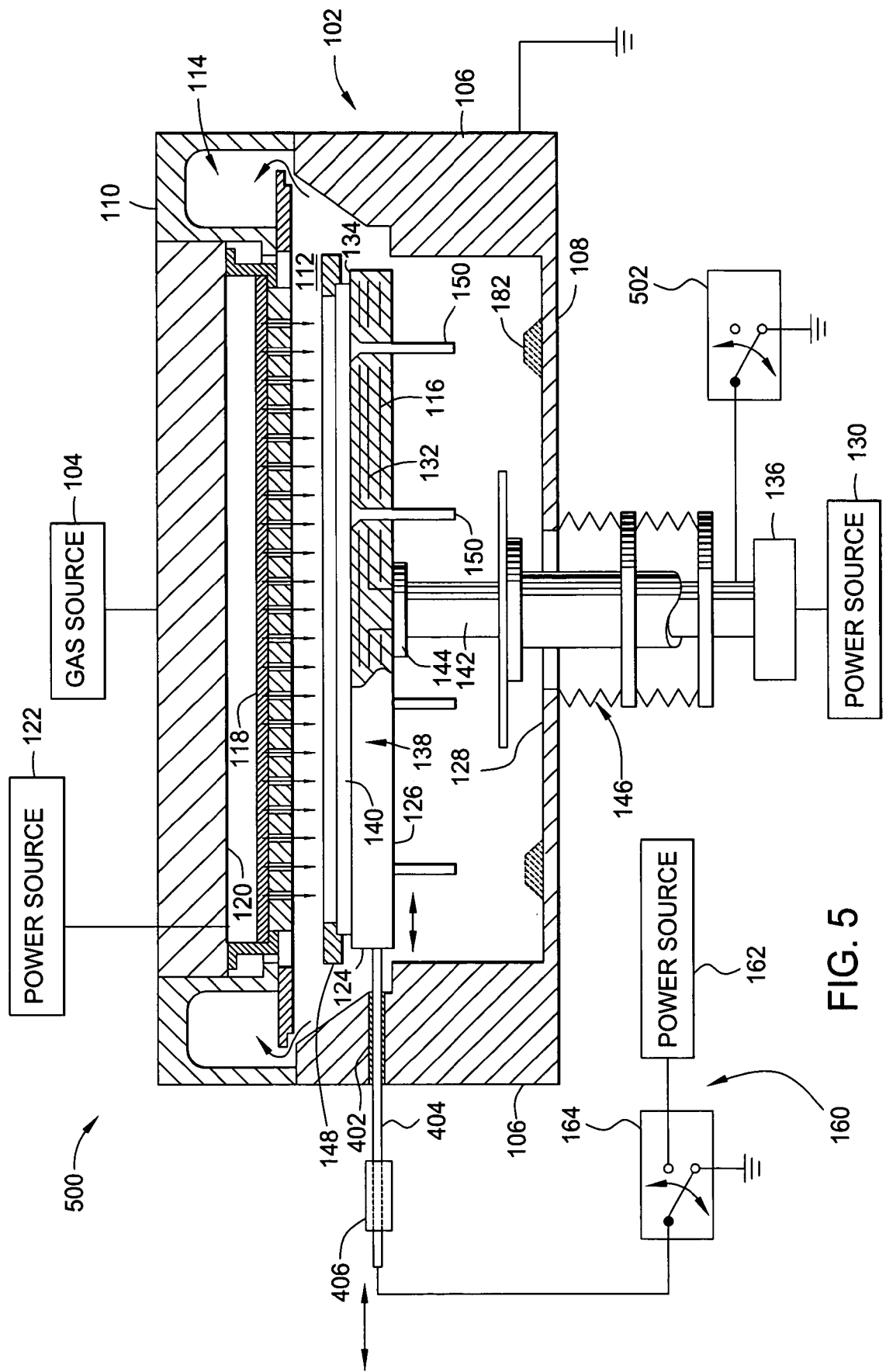
FIG. 5 is a cross sectional view of another embodiment of a plasma enhanced chemical vapor deposition system having a dechucking circuit.

FIG. 5 depicts another embodiment of a plasma enhanced chemical vapor deposition system 500. The system 500 is substantially similar to the system 400 described above, except wherein the dechucking circuit 160 is coupled to the substrate support assembly 138 through the ground member 404. A shaft 142 supporting the substrate support assembly 138 may be selectively coupled to ground through a switch 502, which isolates the substrate support assembly 138 from ground to facilitate dechucking.

The dechucking circuit 160 has a switch 164 which couples the ground member 404 to ground during processing and to the power source 162 to facilitate application of a dechucking signal to the substrate support assembly 138 through the ground member 404 to facilitate dechucking of the substrate as described above. It is contemplated that the actuator 406 may allow the ground member 404 to move relative to the chamber body 102 while the substrate support assembly 138 is moved between the process and lower transfer position to facilitate maintaining electrical contact between the substrate support assembly 138 and the ground member.

Thus, a method and apparatus has been provided for facilitating dechucking of a substrate from a substrate support assembly. Advantageously, the application of the dechucking signal allows the substrate to be easily separated from the substrate support with minimal potential for damage and particle generation which may contaminate the substrate or the process chamber.

While the foregoing is directed to the preferred embodiment of the present invention, other and further embodiments of the invention may be devised without departing from the basic scope thereof, and the scope thereof is determined by the claims that follow.

What is claimed is:

1. A processing chamber comprising:
   a grounded chamber body having an interior volume;
   a substrate support assembly having a body disposed in the interior volume, the body having a substrate support surface;
   at least one ground path coupled to a perimeter of the body of the substrate support assembly at a first end and coupled to the chamber body at a second end;
   a first dechucking circuit having a power source and a first switch, the switch selectively coupling the body of the substrate support assembly through at least one ground path to the power source or ground; and
   a second dechucking circuit having a second switch selectively coupling the substrate support to ground.

2. The processing chamber of claim 1, wherein the ground path has an impedance sufficiently high to appear as an open circuit when pulsed with a high frequency pulse generated from the power source.

3. The processing chamber of claim 2, wherein the signal produced by the power source is a plurality of DC pulses.

4. The processing chamber of claim 2, wherein the signal produced by the power source is an RF signal.

5. The processing chamber of claim 1 further comprising:
   a resistive heater disposed in the substrate support assembly and electrically isolated from the dechucking circuit.

6. The processing chamber of claim 5, wherein the body of the substrate support assembly is aluminum.

7. The processing chamber of claim 1, wherein the ground path further comprises:
   a plurality of ground members moveable between a first position electrically contacting the body of the substrate support assembly and a second position clear of the body of the substrate support assembly.

8. The processing chamber of claim 1, wherein the ground path further comprises:
   a plurality of flexible straps electrically isolated from the chamber body and selectively coupled to ground.

9. The processing chamber of claim 1 further comprising:
   a shaft coupled to the substrate support assembly and the second dechucking circuit, the shaft electrically isolated from the chamber body; and
   a lift mechanism coupled to the shaft and adapted to control an elevation of the substrate support assembly.

10. The processing chamber of claim 9 wherein the ground path further comprises:
    a plurality of ground straps coupling the body of the substrate support assembly to the first dechucking circuit.

11. The processing chamber of claim 1, wherein the power source generates an RF signal.

12. The processing chamber of claim 1, wherein the power source generates a DC signal.

13. The processing chamber of claim 12, wherein the DC signal is a pulse.

14. A processing chamber comprising:
a chamber body;
a substrate support assembly moveably disposed in the chamber body, the substrate support assembly having a body;
a lift mechanism for controlling an elevation of the substrate support assembly;
a ground path selectively coupling a perimeter of the body of the substrate support assembly to ground through a first switch;
a second switch selectively coupling the substrate surport assembly to ground; and
a power source selectively coupled to the body through the ground path and adapted to energize the body with a dechucking voltage.

15. The processing chamber of claim 14, wherein the ground path includes a shaft coupling the body to the lift mechanism.

16. The processing chamber of claim 15, wherein the ground path is coupled to the body outward of the shaft.

17. The processing chamber of claim 16 wherein the first switch coupled to the ground path and selectively coupling the body of the substrate support assembly to the power source or ground.

18. The processing chamber of claim 16 wherein the first switch is coupled to the ground path and selectively opening an electrical path between the body of the substrate support assembly and ground.

19. The processing chamber of claim 14, wherein the ground path further comprising:
a plurality of flexible RF ground straps coupling the body of the substrate support assembly to the chamber body.

20. The processing chamber of claim 19, wherein the ground straps have an impedance sufficiently high to appear as an open circuit when pulsed with a high frequency pulse generated from the power source.

21. The processing chamber of claim 20, wherein the pulse is RF.

22. The processing chamber of claim 20, wherein the pulse is DC.

23. The processing chamber of claim 14, wherein the ground path further comprises:
a plurality of ground rods positionable between a first position electrically coupled to the body of the substrate support assembly and a second position electrically disconnected from the substrate support.

24. The processing chamber of claim 14 wherein the first switch selectively couples the body of the substrate support assembly between ground and the power source.

25. The processing chamber of claim 14, wherein substrate support assembly is adapted to support a substrate having a plan area greater than about 0.25 meters.

* * * * *

UNITED STATES PATENT AND TRADEMARK OFFICE
CERTIFICATE OF CORRECTION

PATENT NO. : 7,375,946 B2 Page 1 of 1
APPLICATION NO. : 10/919457
DATED : May 20, 2008
INVENTOR(S) : White et al.

It is certified that error appears in the above-identified patent and that said Letters Patent is hereby corrected as shown below:

In the Detailed Description:

Column 5, Line 48, please insert --that-- after 164;

In the Claims:

Column 8, Claim 1, Line 22, please insert --the-- after through;

Column 9, Claim 14, Line 11, please delete "surport" and insert --support-- therefor.

Signed and Sealed this

Ninth Day of December, 2008

JON W. DUDAS
*Director of the United States Patent and Trademark Office*